US012800788B2

(12) United States Patent
Zhang et al.

(10) Patent No.: US 12,800,788 B2
(45) **Date of Patent: *Nov. 17, 2026**

(54) PASSIVE MAGNETIC DETECTION AND DISCRIMINATION FOR SECURITY SCREENING

(71) Applicant: Xtract One Technologies Inc., Toronto (CA)

(72) Inventors: Yongming Zhang, San Diego, CA (US); Robert Dickey, Poway, CA (US)

(73) Assignee: Xtract One Technologies Inc.

( * ) Notice: Subject to any disclaimer, the term of this patent is extended or adjusted under 35 U.S.C. 154(b) by 161 days.

This patent is subject to a terminal disclaimer.

(21) Appl. No.: 18/786,668

(22) Filed: Jul. 29, 2024

(65) Prior Publication Data

US 2025/0004158 A1 Jan. 2, 2025

Related U.S. Application Data

(63) Continuation of application No. 17/596,211, filed on Dec. 6, 2021, now Pat. No. 12,050,299.

(51) Int. Cl.
*G01V 3/08* (2006.01)
*G01N 27/72* (2006.01)
(Continued)

(52) U.S. Cl.
CPC ............. *G01V 3/081* (2013.01); *G01R 33/02* (2013.01); *G01R 33/09* (2013.01); *G01R 33/093* (2013.01);
(Continued)

(58) Field of Classification Search
CPC .......... G01V 3/081; G01V 3/10; G01V 3/104; G06N 20/00; G01R 33/09; G01R 33/093;
(Continued)

(56) References Cited

U.S. PATENT DOCUMENTS

2007/0052411 A1* 3/2007 McClure .................. G01V 3/15
324/228
2008/0117044 A1* 5/2008 Hibbs .................... G01V 3/105
340/568.1

(Continued)

FOREIGN PATENT DOCUMENTS

WO WO 2016120379 * 8/2016 ............... G07C 9/00

*Primary Examiner* — Raul J Rios Russo

(57) ABSTRACT

A passive magnetic detection and discrimination system and method is disclosed. The system comprises at least one sensing structure having a plurality of magnetic inductive sensors arranged on a rigid framework; at least one screening area defined by one or more sensing structures, whereby the plurality of magnetic inductive sensors are configured to respond to a magnetized object passing thereby; and a processor and a memory operatively connected to the plurality of sensors and configured to receive data corresponding to amplitude waveforms created in each of the plurality of sensors by the magnetized object. Based on characteristic waveforms created by the magnetized object passing by the plurality of sensors, the system is configured to detect and discriminates the magnetized object. In another embodiment, the system utilizes an artificial intelligence or machine learning module to improve identification of a magnetized object based on the characteristic waveforms created by the magnetized object.

12 Claims, 10 Drawing Sheets

(51) Int. Cl.

| | |
|---|---|
| ***G01N 27/82*** | (2006.01) |
| ***G01N 27/90*** | (2021.01) |
| ***G01R 33/02*** | (2006.01) |
| ***G01R 33/09*** | (2006.01) |
| ***G01V 3/10*** | (2006.01) |
| ***G06N 20/00*** | (2019.01) |

(52) U.S. Cl.
CPC ................ *G01V 3/10* (2013.01); *G01V 3/104* (2013.01); *G01N 27/72* (2013.01); *G01N 27/82* (2013.01); *G01N 27/9046* (2013.01); *G06N 20/00* (2019.01)

(58) Field of Classification Search
CPC ........ G01R 33/02; G01N 27/72; G01N 27/82; G01N 27/9046
USPC .......................................................... 324/200
See application file for complete search history.

(56) References Cited

U.S. PATENT DOCUMENTS

| | | | | |
|---|---|---|---|---|
| 2016/0245072 | A1* | 8/2016 | Brooks | E21B 47/092 |
| 2018/0357472 | A1* | 12/2018 | Dreessen | G06V 20/49 |
| 2019/0003908 | A1* | 1/2019 | Lanter | B62M 6/40 |
| 2019/0265071 | A1* | 8/2019 | Ruigrok | G01D 5/16 |
| 2021/0278245 | A1* | 9/2021 | Degois | G01D 5/145 |
| 2022/0334286 | A1* | 10/2022 | Seren | G01V 3/081 |

* cited by examiner

PASSIVE MAGNETIC DETECTION AND DISCRIMINATION FOR SECURITY SCREENING

CROSS-REFERENCE TO RELATED APPLICATIONS

This application is a US-Continuation application of U.S. application Ser. No. 17/596,211 entitled "PASSIVE MAGNETIC DETECTION AND DISCRIMINATION FOR SECURITY SCREENING", filed on Dec. 6, 2021. This application also claims priority to and the benefit of the international PCT Patent Application No. PCT/US2020/036693 entitled "PASSIVE MAGNETIC DETECTION AND DISCRIMINATION FOR SECURITY SCREENING", filed on Jun. 8, 2020, which claims the benefit of U.S. Provisional Application No. 62/858,055, filed on Jun. 6, 2019, the entirety of which are incorporated herein by reference.

FIELD

This disclosure relates to the field of magnetic detection systems and methods.

BACKGROUND

Most security screening devices rely on an applied magnetic field to induce electric currents in metallic objects, and then detect the magnetic field produced in the objects by this current. These systems take advantage of their control of the applied field to generate a sufficient signal, to discriminate the measured signals from environmental noise, and to detect very small metallic objects. All threat objects have metallic parts in them.

Passive magnetic-based screening systems detect magnetized objects, and do not utilize an applied field but instead rely on the Earth's magnetic field, and thus must use detection circuitry with very high sensitivity. In addition, measures must be taken to isolate the magnetic field detectors from environmental interference and the effect of vibration in the Earth's magnetic field. The standard method to achieve such noise isolation is to subtract the outputs of two calibrated and balanced sensors from each other, in what is known as a 'gradiometer configuration'. The sensors must be rigidly connected so that they move as a common unit and situated such that one couples to the signal of interest more strongly than the other. However, the latter requirement results in a system structure much larger than it otherwise would need to be. Furthermore, the number of sensors required may make such screening systems too expensive for certain screening applications.

What is therefore needed is an improved system for passive magnetic field detection which overcomes at least some of these limitations in the prior art.

SUMMARY

The present disclosure relates to a passive magnetic detection and discrimination system and method for security screening.

In an aspect, there is provided a passive magnetic detection and discrimination system, comprising: at least one sensing structure having a plurality of magnetic inductive sensors arranged on a rigid framework; at least one screening area defined by one or more sensing structures, whereby the plurality of magnetic inductive sensors are configured to respond to a magnetized object passing thereby; and a processor and a memory operatively connected to the plurality of sensors and configured to receive data corresponding to amplitude waveforms created in each of the plurality of sensors by the magnetized object; wherein based on characteristic waveforms created by the magnetized object passing by the plurality of sensors, the system detects and discriminates the magnetized object.

In an embodiment, the system utilizes an artificial intelligence or machine learning module to improve identification of a magnetized object based on the characteristic waveforms created by the magnetized object.

In another aspect, there is provided a passive magnetic detection and discrimination method, comprising: providing at least one sensing structure having a plurality of magnetic inductive sensors arranged on a rigid framework; providing at least one screening area defined by one or more sensing structures, whereby the plurality of magnetic inductive sensors are configured to respond to a magnetized object passing thereby; and operatively connecting and configuring a processor and a memory to the plurality of sensors to receive data corresponding to amplitude waveforms created in each of the plurality of sensors by the magnetized object; and based on characteristic waveforms created by the magnetized object passing by the plurality of sensors, detecting and discriminating the magnetized object.

In an embodiment, the number of sensors and the positioning and orientation of the sensors mounted to the framework are chosen to preferentially discriminate between different types of magnetized objects being screened.

In another embodiment, the rigid framework of the sensing structure may be made from metallic or non-metallic materials, and may serve to hide the number, location, and orientation of the magnetic sensors.

In another embodiment, the system further comprises a processor and memory adapted to receive information from the magnetic induction sensors in response to an object passing by the sensing structures, and to generate amplitude waveforms characteristic of the type of object passing through.

In another embodiment, the system utilizes artificial intelligence and machine learning to improve identification of objects based on the characteristic waveforms created in the sensors by the passing object.

In another embodiment, the system further includes a camera to capture an image or a video of a subject to help identify the type of object detected by the system.

In this respect, before explaining at least one embodiment of the invention in detail, it is to be understood that the invention is not limited in its application to the details of construction and to the arrangements of the components set forth in the following description or the examples provided therein, or illustrated in the drawings. Therefore, it will be appreciated that a number of variants and modifications can be made without departing from the teachings of the disclosure as a whole. Therefore, the present system, method and apparatus is capable of other embodiments and of being practiced and carried out in various ways. Also, it is to be understood that the phraseology and terminology employed herein are for the purpose of description and should not be regarded as limiting.

BRIEF DESCRIPTION OF THE DRAWINGS

The present system and method will be better understood and objects of the invention will become apparent when consideration is given to the following detailed description thereof. Such description makes reference to the annexed drawings, wherein:

FIG. 1(*b*) shows a corresponding schematic block diagram of the magnetic induction sensor of FIG. 1(*a*).

DETAILED DESCRIPTION

As noted above, the present disclosure relates a passive magnetic detection and discrimination system and method for security screening.

Magnetic sensors that have been used to date in prior art passive systems are DC coupled. This means they respond directly to the Earth's static magnetic field, and are accordingly strongly affected by low-frequency motion in that field. Such motion is caused, for example, by people walking nearby and the operation of vehicles and machinery, and is very likely to be present in practical security screening scenarios. In addition, practical, affordable prior art DC-coupled magnetic sensors are limited to about 10 pT/Hz½ at the frequencies of interest for passive security screening.

A more preferable type of magnetic sensor is a magnetic induction sensor. This type of sensor is AC coupled, and so does not suffer from the problem of DC coupled sensors which are susceptible to very low frequency signals. Also, a magnetic induction sensor can be easily configured so that it does not respond to signals above a certain defined frequency. The magnetic induction sensor has a further advantage of having the highest sensitivity (<1 pT/Hz½) of room temperature magnetic field sensors. However, conventional magnetic induction sensors are often too large and too expensive to be used in most screening applications.

To address this problem, the present system utilizes a customized magnetic induction sensor which has been developed specifically for this application. The sensor is small enough such that multiple units can be built into the structure of a walk-through screening system, while retaining sensitivity of the order of a few pT/Hz½.

Figure 1A:
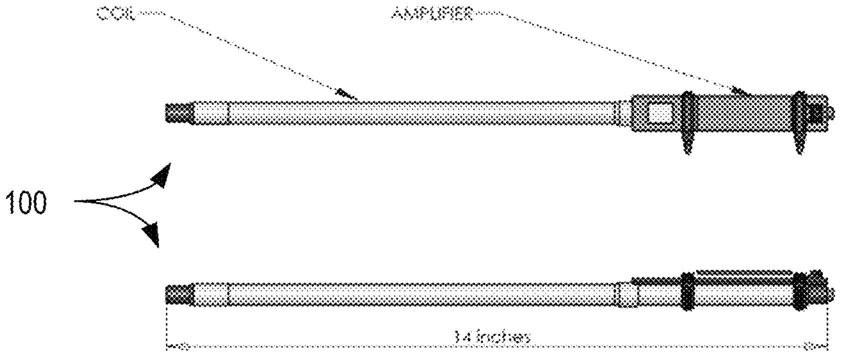
FIG. 1(*a*) shows a diagram of a magnetic induction sensor in accordance with an illustrative embodiment.
Figure 1B:
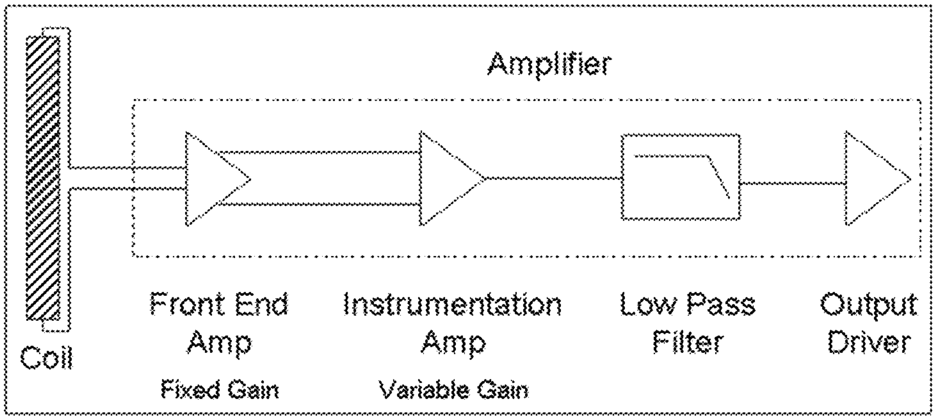

FIG. 1(*a*) shows a drawing of a magnetic induction sensor 100 optimized for the present screening system. A corresponding schematic block diagram is shown in FIG. 1(*b*).

Figure 2:
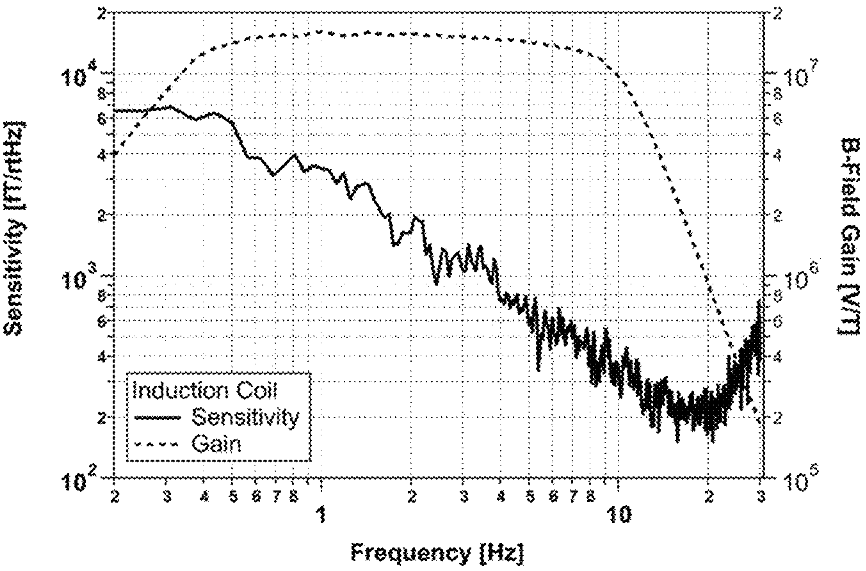
FIG. 2 shows an illustrative graph of the sensitivity and magnetic field gain of the magnetic induction sensor of FIGS. 1(*a*) and 1(*b*).
Figure 3A:
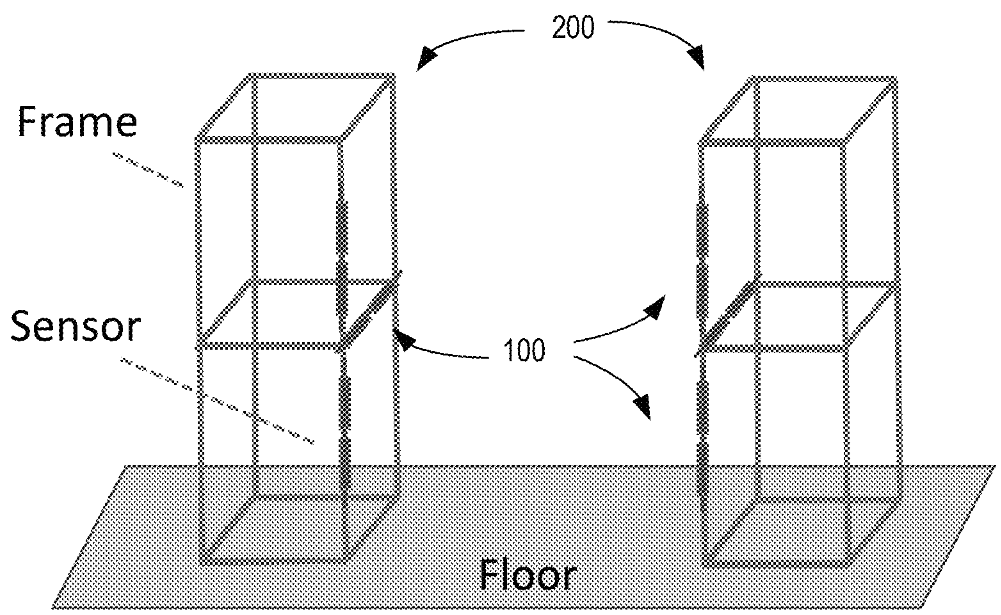
FIGS. 3(*a*) to 3(*h*) show illustrative examples of pairs of sensing structures having magnetic induction sensors mounted to a framework in various geometric configurations.
Figure 3B:
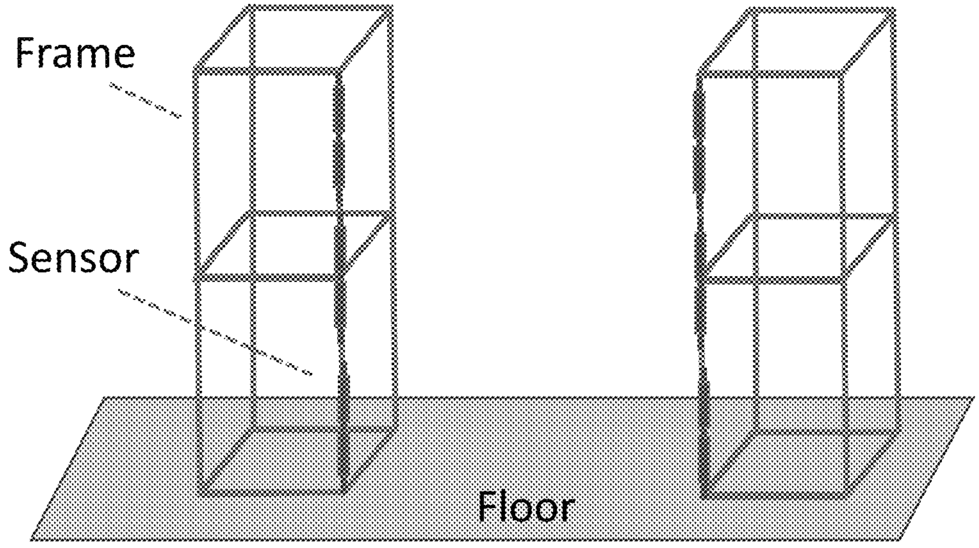
Figure 3C:
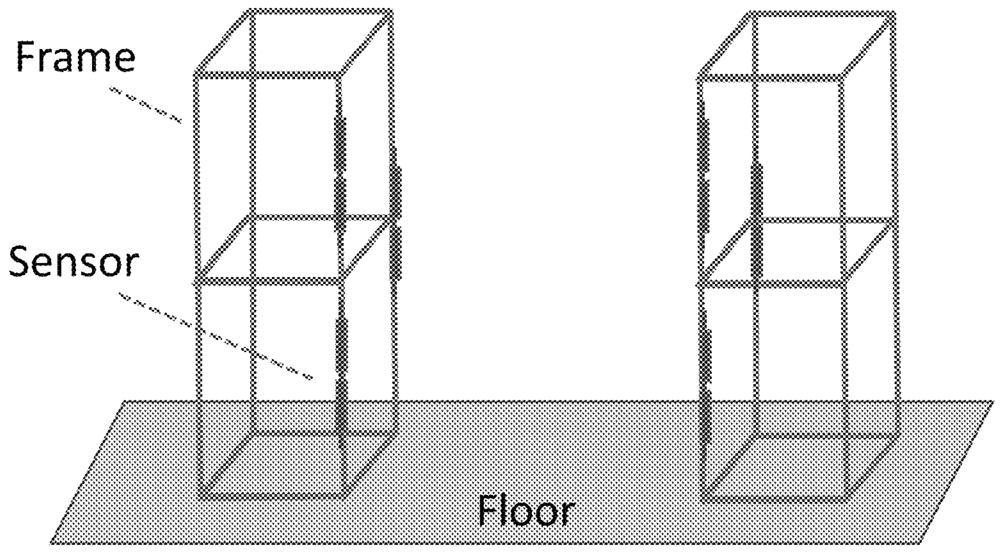
Figure 3D:
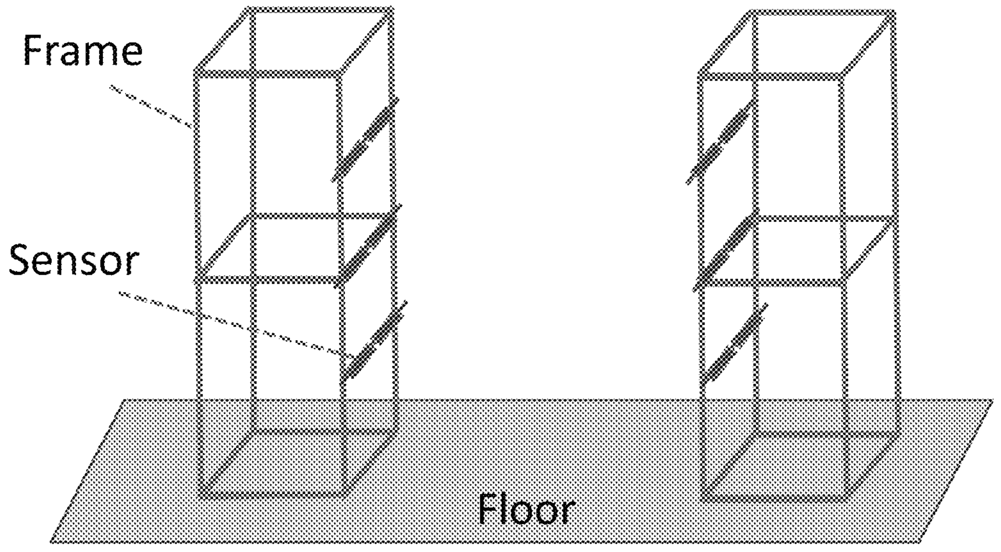
Figure 3E:
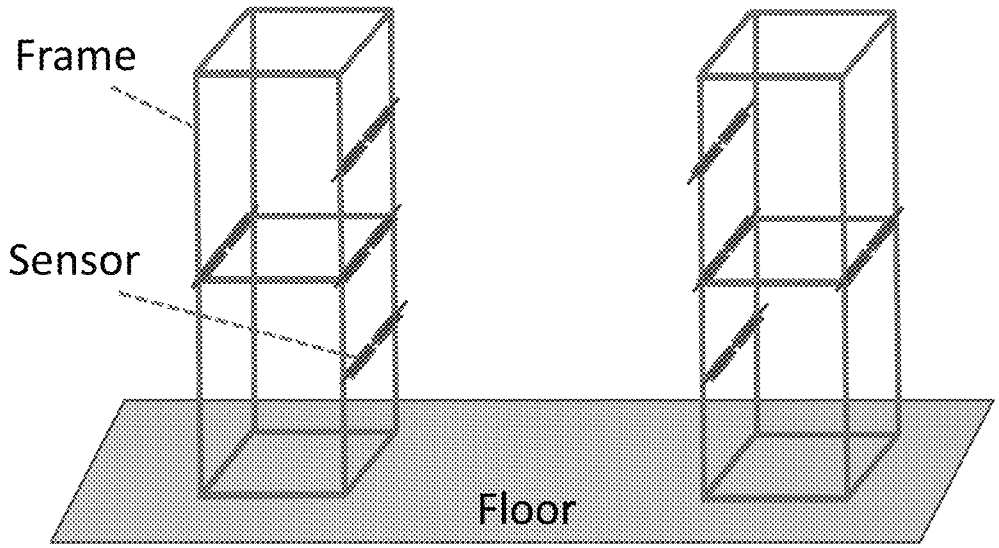
Figure 3F:
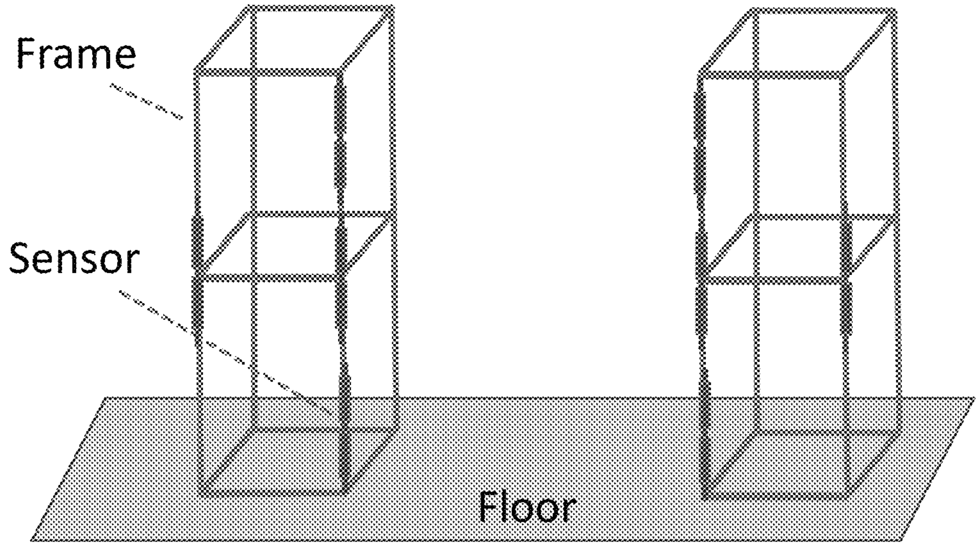
Figure 3G:
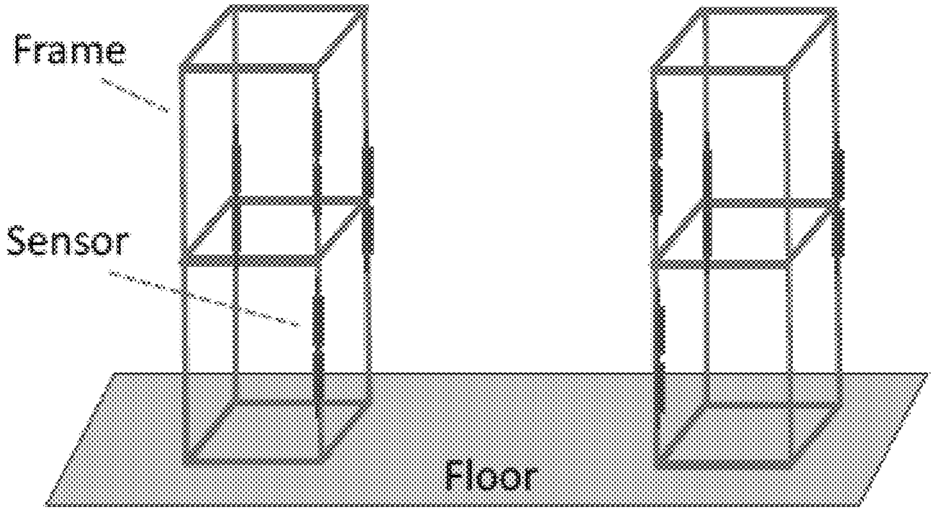
Figure 3H:
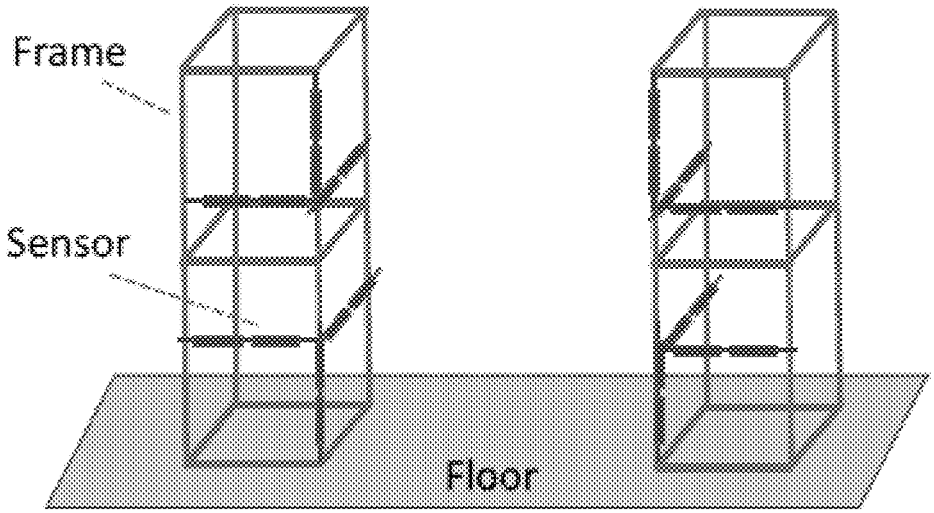

In FIG. 2, the sensitivity and magnetic field gain of a 14-inch long sensor optimized for the screening system are shown. The sensitivity is less than 4 pT/rtHz at 1 Hz, and the bandwidth is from 0.3 Hz to 10 Hz. The length of the coil can be reduced further for more compact systems.

Magnetic induction sensors have the benefit that, owing to their simple, linear, high-permeability cores, it is relatively simple to null the pickup of external noise by feeding an active signal to a small coil coupled to them. Such active nulling allows cancellation of the power line interference that typically limits the dynamic range of magnetic sensors, enabling the full sensitivity of the magnetic induction sensors to be exploited. In addition, new software-based adaptive nulling methods have been recently tested on magnetic induction sensors and have produced effective detection sensitivities a factor of 10 below the environmental magnetic field level.

Thus, the application of this type of magnetic induction sensor and the associated noise reduction techniques makes possible the construction of an improved passive screening device for magnetized objects.

The improved sensitivity allows a reduction in the number of sensors needed, and enables a wider, more open gateway. The use of active noise cancellation methods enables the full sensitivity of an induction sensor to be used without constructing gradiometers, in addition to allowing detection of very small objects in a practical environment.

An illustrative example will now be described with reference to the drawings.

Now referring to FIGS. 3(*a*) to 3(*f*), shown are illustrative examples of sensing structures 200 with passive magnetic induction sensors 100 mounted to a framework in a specified geometric configuration to permit object discrimination for the type of target object for which the system is designed.

For example, FIG. 3(*a*) shows an illustrative example of two sensing structures 200 comprising passive magnetic sensors 100 mounted to a framework in a generally "T"-shaped geometric configuration which is designed to detect a long rifle, at least a portion of which is magnetized.

In an embodiment, the sensing structures may be used alone or in combination with other sensing structures (e.g. a mirrored pair) to form a screening area through which subjects pass while being screened. For example, as shown in FIG. 3(*a*), two sensing structures with sensors in a mirrored geometric configuration are placed on a floor on either side of a screening area in a portal configuration.

Other geometric configurations of the sensors are possible, as shown for example in FIGS. 3(*b*) to 3(*f*). Given the different geometric configurations of the sensors, each will have its own unique detection, and false alarm rejection characteristics. Using more sensors in a screening system may improve the false alarm rejection rate. These sensing structures may be used along with other security features (e.g. video as described further below) to define the portal screening area through which a subject must pass.

Still referring to FIGS. 3(*a*) to 3(*h*), the outer sensors mounted on the outside positions of the sensing structures, as shown for example in configurations 3(*e*), 3(*f*), and 3(*g*), may be configured and utilized for background noise cancellation purposes, and for determining the rate of magnetic field decay from the object. As these outer sensors are further away from the object being detected, they can be used to determine ambient background noise which can be subtracted from the other sensors closer to the detected object.

Figure 7:
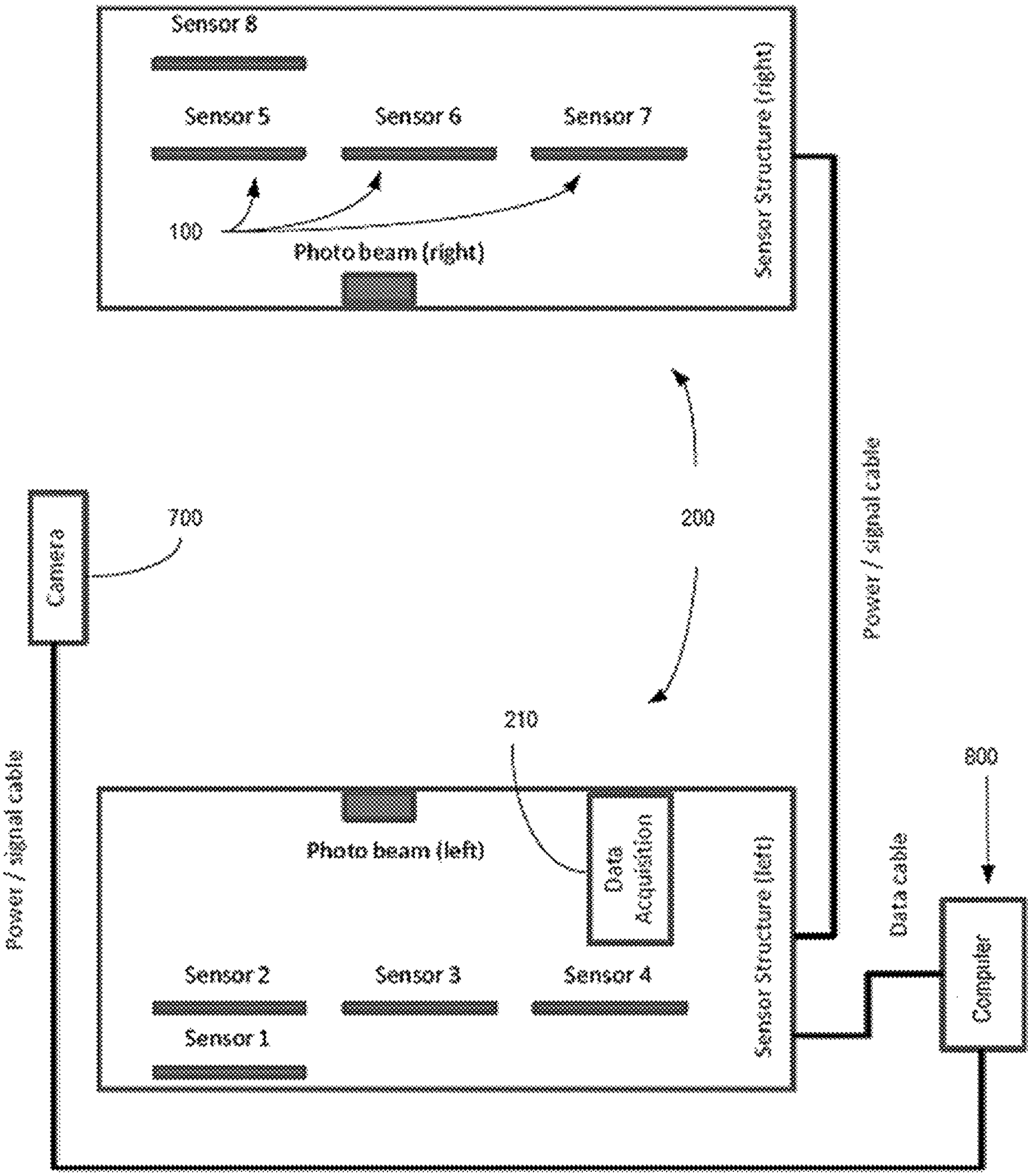
FIG. 7 shows a schematic block diagram of a passive magnetic detection and discrimination system in accordance with another embodiment.
Figure 8:
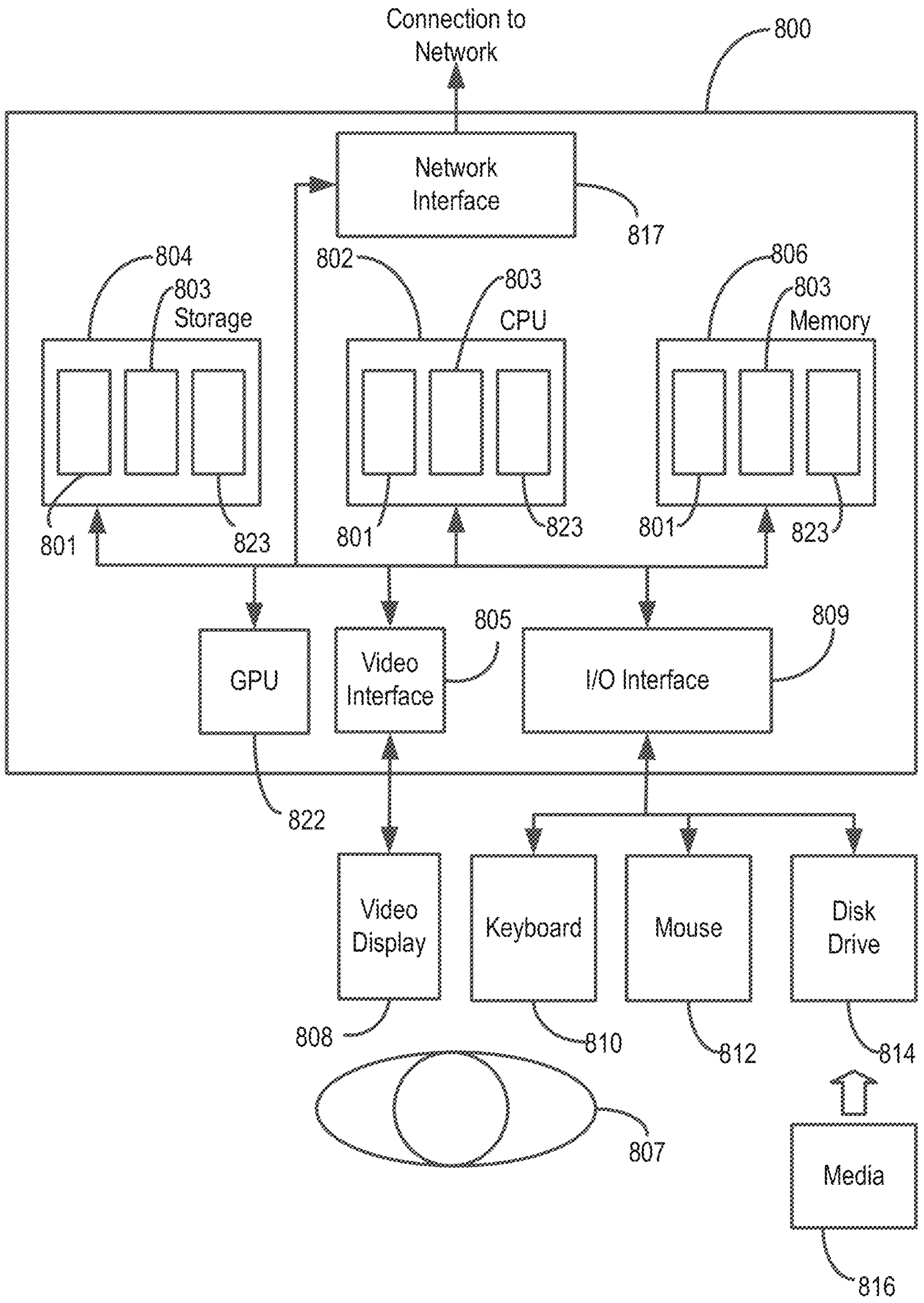
FIG. 8 shows a schematic block diagram of an illustrative computing device adapted to provide an operating environment for various embodiments.

By using two 3-axis sensors on each sensing structure, i.e., 12 sensors in total in the illustrative example in FIG. 3(*h*), the system can acquire the three perpendicular components of the magnetic field, and is capable of providing 3D positioning data suitable for artificial intelligence (AI) or machine learning (ML) detection modules executed by the system (e.g. on a computer as illustrated in FIG. 7 and FIG. 8).

Figure 4:
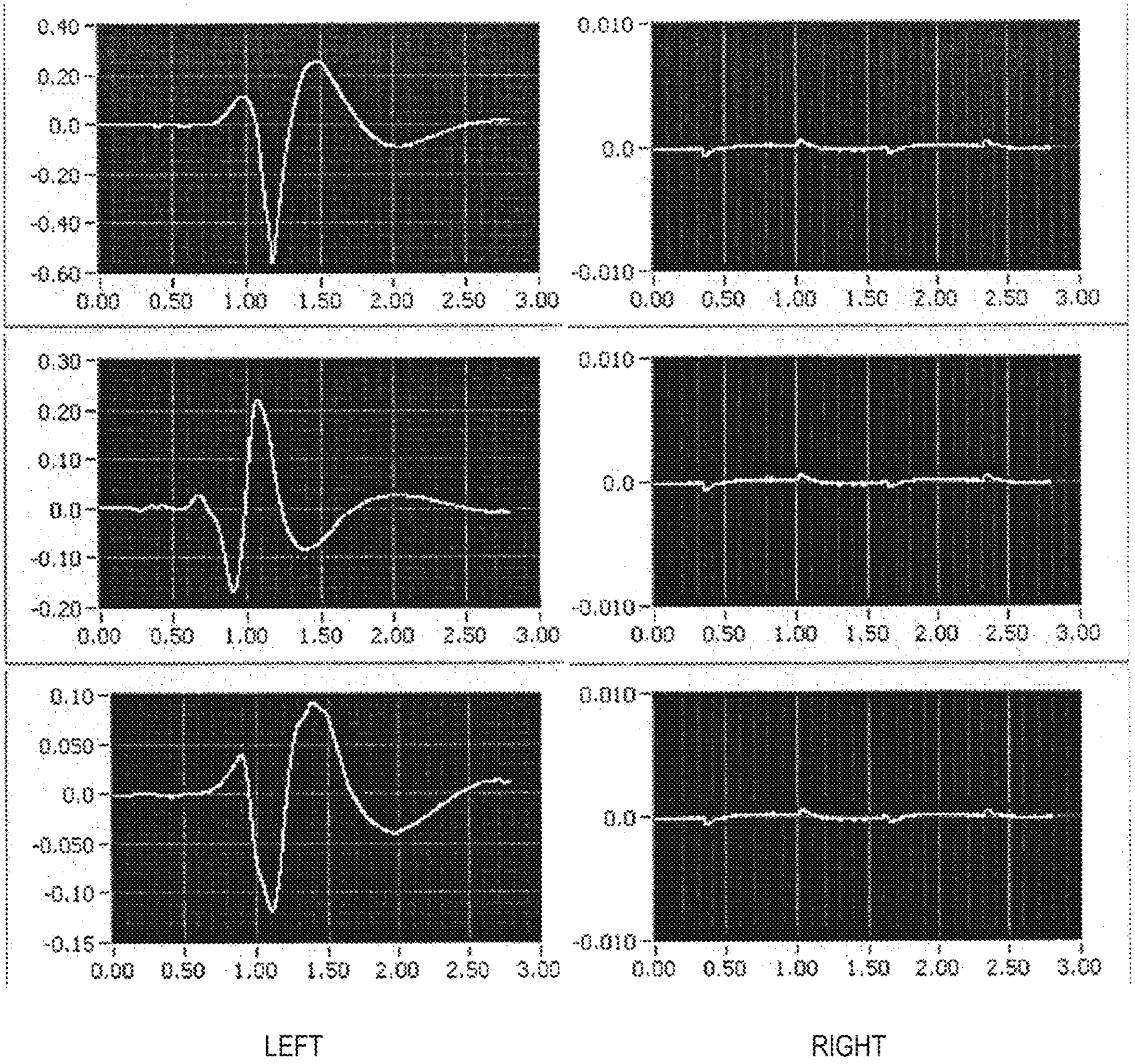
FIG. 4 shows amplitude signals obtained from a portal with sensors responding to a small "point-like" object.

In an embodiment, different methods are used to discriminate between different types of magnetized objects. In a first method, the amplitude of the signal recorded in each sensor is compared with the amplitude recorded in each of the other sensors. The variation in amplitudes between different sensors is directly related to the magnetic moment of the object and the physical size of the magnetized region of the object. For example, FIG. 4 shows amplitude signals obtained from a portal with sensors responding to a small "point-like" object. In this example, the portal has six sensors arranged in a configuration shown in illustrative FIG. 3(*b*).

A small magnetized object, relative to the size of the sensing structure and the sensors, will have an associated magnetic field similar to that of an infinitesimally small point dipole source. The dipole field falls off as R−3 at distances far from the source. Consequently, a small object in the vicinity of the sensing structure will produce a signal at a nearby sensor and a considerably diminished signal at adjacent sensors. An illustrative example of signals seen from six sensors is shown in FIG. 4. Based on the characteristics of the amplitude signals at these six sensors, the system is able to identify that the type of object which created the amplitude waveforms is a small, "point-like" object.

Figure 5:
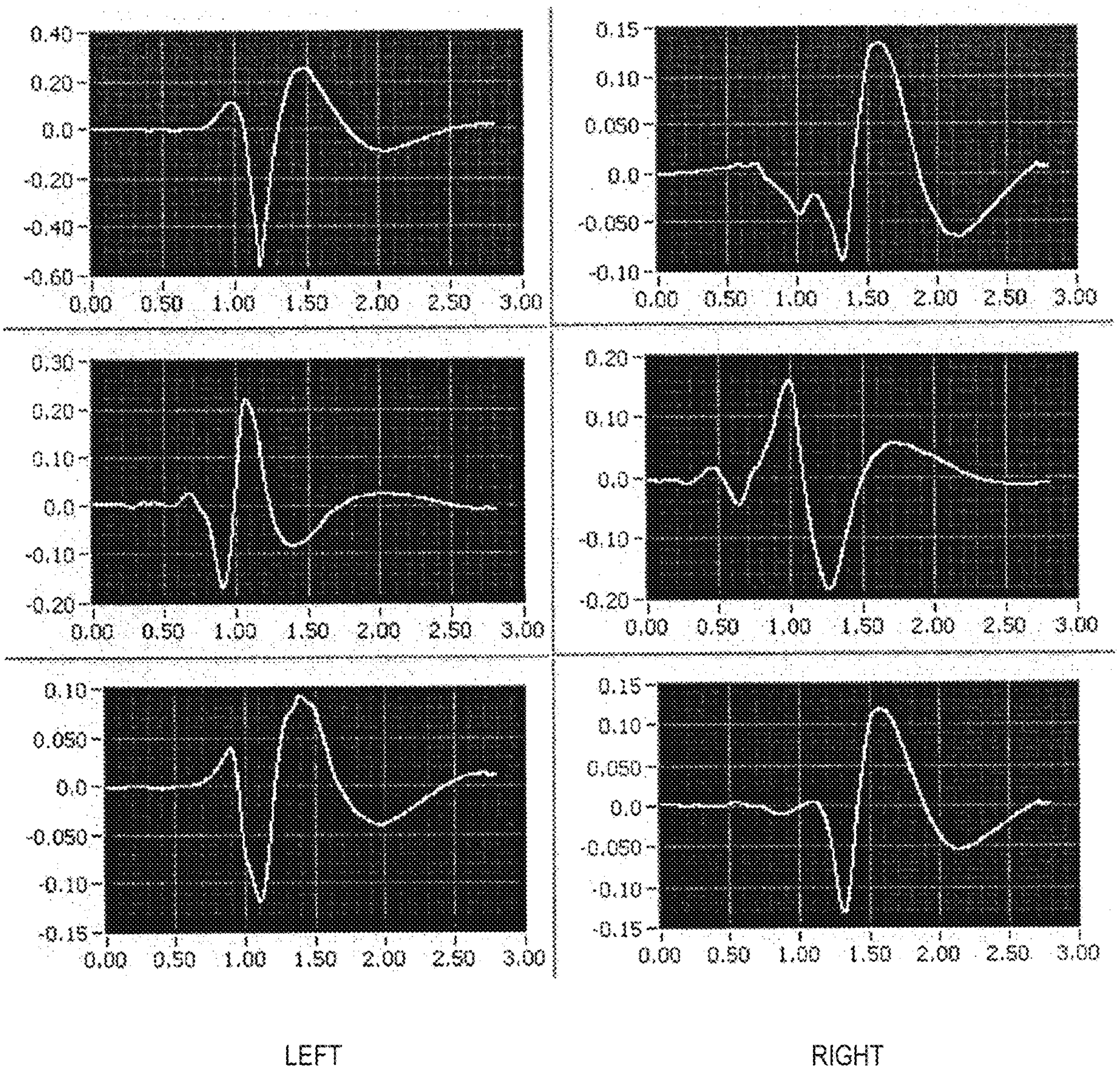
FIG. 5 shows amplitude signals from a portal with sensors responding to a large non-"point-like" object.

FIG. 5 is another illustrative example, showing amplitude signals from six sensors of a sensing structure portal with sensors responding to a large, non-"point-like" object. The amplitude variations shown in FIG. 5 for a large non-"point-like" object are quite distinct from the amplitudes created by the small object in FIG. 4, and based on the characteristics of the amplitude waveforms, the system is able to determine that the type of object which created these amplitude waveforms is a large, non-"point-like" object. Examples of a large, non-"point-like" object may be, for example, a rifle or other long gun.

Comparing the characteristic waveforms which result from a complex relationship between the sensing structure configuration, the orientation of the induction sensors, and the magnetic fields from the detected object, the system is able to determine the object's magnetic dipole moment, relative size and shape.

For example, a large object may produce a signal of similar magnitude at more than one sensor and the signals may not be observed to diminish appreciably except at the sensor located at the furthest distance from the object. An example of signals seen in this case is shown in FIG. 5.

In an embodiment, a threshold on the amplitude of the signals seen at each sensor and the variation in the amplitudes among sensors are used as a first discrimination method. One of the applications of a first discrimination method is to eliminate false alarms from the passage of non-threatening magnetized objects, including but not limited to steel shoe shanks and cellphones, through the screening area, because these objects produce signals that have the characteristics of a point source.

Figure 6:
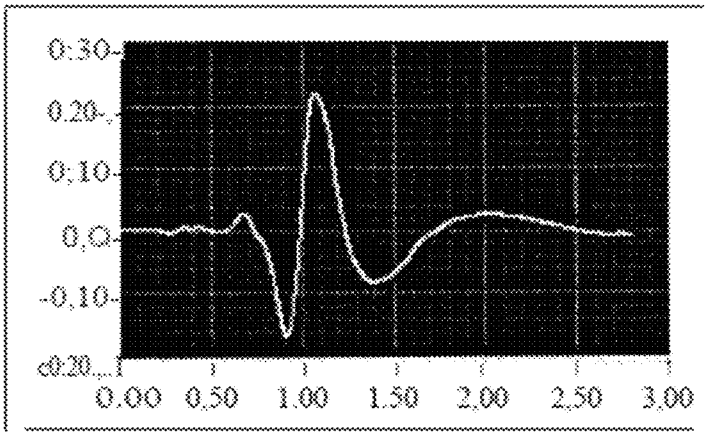
FIG. 6 shows a time-domain signal from sensors demonstrating a response to a dipole source as a function of time.

In a second discrimination method, the amplitude of a signal from each sensor is recorded as a function of time, i.e., a waveform, while the subject passes near the sensing structure. The waveform signature is compared with the signature of an ideal magnetic dipole to determine several characteristics of the object, including the size of the magnetic moment of the object, the location of the object with respect to the sensor, and the speed with which the object passed by the sensing structure. The results of this method for the signals from each sensor are compared to determine if a threat object exists and, if so, where is the most probable location of the threat. A typical waveform corresponding to a magnetic dipole is shown by way of example in FIG. 6.

An advantage of the present system and method is that the system and method reject common background noise, and detects signals smaller than the background. Furthermore, by forming the sensing structure with an array of small, sensitive, 3-axis magnetic sensors, the system identifies the source location and determines three components of the magnetic field due to the object, therefore allowing identification of the shape of the magnetized region of the object for discrimination.

In an embodiment, using the principles of Artificial Intelligence (AI) and Machine and/or Deep Learning (ML), training data collected by the system is used to expand the capability of the system and method to discriminate between threat and non-threat detected objects.

As illustrated in FIG. 7, in an embodiment, the system uses a video camera 700 to record video of subjects while they are being screened, which assists in identifying magnetized subjects determined to be possibly carrying threats. Sensor structures containing a plurality of sensors are positioned to define a portal through which a subject must pass, and a photo beam can be positioned to trigger the system to perform an analysis. A computer shown in FIG. 7 may be a generic computer 800 such as illustrated in FIG. 8, which may provide an operating environment to execute code for analyzing sensor data collected by a data acquisition module 210, and for executing pattern detection using an AI or ML engine executing on computer 800 to improve detection and identification of objects.

By receiving amplitude signals from the sensors mounted on sensing structures, for example as shown in FIG. 3(*a*), the system is able to determine 3D positional data of the object within the portal screening area between the sensing structures. By comparing this positional information with a video photo of a subject captured by the camera, the system is able to identify where the object may be located, for example in a bag being carried by a subject, in a backpack carried by a subject, or concealed under loose clothing worn by a subject, etc.

In an embodiment, the system may be configured to alert security personal by highlighting the location of the object that is strongly magnetized, for example by outlining a bag or a backpack in red or yellow outline on a security screen being monitored by security personnel. The detection threshold can be customized by the user as well as the warning color.

In another embodiment, the photos or videos associated with the sensor amplitude characteristics may provide training data to be received by the system's AI or ML engine (e.g., as executed on the computer in FIG. 7) in order to train the system to improve its ability to identify and discriminate objects being screened.

Now referring to FIG. 8, shown is a schematic block diagram of a generic computing device that may provide a suitable operating environment for one or more embodiments of the adaptive data transfer protocol as described above. One or more suitably configured computer devices, and associated communications networks, devices, software and firmware may collectively provide a platform for enabling one or more embodiments. By way of example, FIG. 8 shows a generic computer device 800 that may include a central processing unit ("CPU") 802 connected to a storage unit 804 and to a random access memory 806. The CPU 802 may process an operating system 801, application program 803, and data 823. The operating system 801, application program 803, and data 823 may be stored in storage unit 804 and loaded into memory 806, as may be required. Computer device 800 may further include a graphics processing unit (GPU) 822 which is operatively connected to CPU 802 and to memory 806 to offload intensive image processing calculations from CPU 802 and run these calculations in parallel with CPU 802. An operator 810 may interact with the computer device 800 using a video display 808 connected by a video interface 805, and various input/output devices such as a keyboard 810, pointer 812, and storage 814 connected by an I/O interface 809. In known manner, the pointer 812 may be configured to control movement of a cursor or pointer icon in the video display 808, and to operate various graphical user interface (GUI) controls appearing in the video display 808. The computer device 800 may form part of a network via a network interface 811, allowing the computer device 800 to communicate with other suitably configured data processing systems or circuits.

Advantageously, the passive magnetic detection and discrimination system and method in accordance with the present disclosure provides improved sensitivity utilizing more cost effective magnetic induction sensors, and allows the system to be used in high throughput applications with a larger screening area.

Also, due to the fact that the magnetic sensing technology is passive and therefore does not emit any electromagnetic fields, the technology is capable of being implemented in a covert manner such that a subject being screened is not aware that screening is taking place.

Thus, in an aspect, there is provided a passive magnetic detection and discrimination system, comprising: at least one sensing structure having a plurality of magnetic inductive sensors arranged on a rigid framework; at least one screening area defined by one or more sensing structures, whereby the plurality of magnetic inductive sensors are configured to respond to a magnetized object passing thereby; and a processor and a memory operatively connected to the plurality of sensors and configured to receive data corresponding to amplitude waveforms created in each of the plurality of sensors by the magnetized object; wherein based on characteristic waveforms created by the magnetized object passing by the plurality of sensors, the system detects and discriminates the magnetized object.

In an embodiment, the system utilizes an artificial intelligence or machine learning module to improve identification of a magnetized object based on the characteristic waveforms created by the magnetized object.

In another embodiment, the plurality of sensors is positioned and oriented on the rigid framework to discriminate between different types of magnetized objects.

In another embodiment, the rigid framework is at least partially non-metallic.

In another embodiment, the rigid framework of the sensing structure hides the number, location, and orientation of the magnetic sensors such that the screening area for detection of subjects with magnetized objects passing by is covert.

In another embodiment, the system further comprises a video camera for capturing an image or video of a subject passing through the screening area to assist the system with discriminating whether the magnetized object is a threat.

In another embodiment, the system is further adapted to correlate the image or video of the subject with 3D locational data of the magnetized object calculated from data corresponding to amplitude waveforms created by the sensors to flag a location of the magnetized object in the image or video.

In another embodiment, the system is further adapted to provide the captured image or video of a subject as an additional input to an artificial intelligence or machine learning module to improve system identification and discrimination of a magnetized object.

In another aspect, there is provided a passive magnetic detection and discrimination method, comprising: providing at least one sensing structure having a plurality of magnetic inductive sensors arranged on a rigid framework; providing at least one screening area defined by one or more sensing structures, whereby the plurality of magnetic inductive sensors are configured to respond to a magnetized object passing thereby; and operatively connecting and configuring a processor and a memory to the plurality of sensors to receive data corresponding to amplitude waveforms created in each of the plurality of sensors by the magnetized object; and based on characteristic waveforms created by the magnetized object passing by the plurality of sensors, detecting and discriminating the magnetized object.

In an embodiment, the method further comprises utilizing an artificial intelligence or machine learning module to improve identification of a magnetized object based on the characteristic waveforms created by the magnetized object.

In another embodiment, the method further comprising positioning and orienting the plurality of sensors on the rigid framework to discriminate between different types of magnetized objects.

In another embodiment, the rigid framework is at least partially non-metallic.

In another embodiment, the method further comprises hiding the number, location, and orientation of the magnetic sensors in the rigid framework of the sensing structure, such that the screening area for detection of subjects with magnetized objects passing by is covert.

In another embodiment, the method further comprises providing a video camera for capturing an image or video of a subject passing through the screening area to assist the system with discriminating whether the magnetized object is a threat.

In another embodiment, the method further comprises correlating the image or video of the subject with 3D locational data of the magnetized object calculated from data corresponding to amplitude waveforms created by the sensors to flag a location of the magnetized object in the image or video.

In another embodiment, the method further comprises providing the captured image or video of a subject as an additional input to an artificial intelligence or machine learning module to improve system identification and discrimination of a magnetized object.

While illustrative embodiments have been described above by way of example, it will be appreciated that various changes and modifications may be made without departing from the scope of the invention, which is defined by the following claims.

The invention claimed is:

1. A passive magnetic detection and discrimination system to detect a magnetized object, comprising:

at least one sensing structure having a plurality of magnetic inductive sensors arranged on a rigid framework;

at least one screening area defined by the at least one sensing structure, whereby the plurality of magnetic inductive sensors are configured to respond to the magnetized object passing thereby;

a processor and a memory operatively connected to the plurality of sensors and configured to receive data corresponding to amplitude waveforms created in each of the plurality of sensors by the magnetized object, wherein the processor is configured to compare the amplitude of a signal recorded by each sensor with the amplitude recorded by each of the other sensors to determine a magnetic moment and a physical size of a magnetized region of the object, and to compare a waveform signature from each sensor with a signature of an ideal magnetic dipole to determine characteristics of the object including a size of the magnetic moment, a location of the object with respect to the sensor, and a speed with which the object passed by the sensing structure;

a video camera for capturing an image or video of a subject with the magnetized object passing through the screening area to assist the system with discriminating whether the magnetized object is a threat; and wherein based on characteristic waveforms created by the magnetized object passing by the plurality of sensors, the system detects and discriminates the magnetized object;

wherein the system further comprises an artificial intelligence or machine learning module to improve identification of the magnetized object based on the characteristic waveforms created by the magnetized object.

2. The system of claim 1, wherein the plurality of sensors is positioned and oriented on the rigid framework to discriminate between different types of magnetized objects.

3. The system of claim 1, wherein the rigid framework is at least partially non-metallic.

4. The system of claim 1, wherein the rigid framework of the sensing structure hides the number, location, and orientation of the magnetic sensors such that the screening area for detection of subjects with magnetized objects passing by is covert.

5. The system of claim 1, wherein the system is further adapted to correlated the image or video of the subject with 3D locational data of the magnetized object calculated from data corresponding to amplitude waveforms created by the sensors to flag a location of the magnetized object in the image or video.

6. The system of claim 1, wherein the system is further adapted to provide a captured image or video of a subject as an additional input to the artificial intelligence or machine learning module to improve system identification and discrimination of the magnetized object.

7. A passive magnetic detection and discrimination method for detecting a magnetized object, comprising:

providing at least one sensing structure having a plurality of magnetic inductive sensors arranged on a rigid framework;

providing at least one screening area defined by the at least one sensing structure, whereby the plurality of magnetic inductive sensors are configured to respond to the magnetized object passing thereby;

providing a video camera for capturing an image or video of a subject with the magnetized object passing through the screening area to assist the system with discriminating whether the magnetized object is a threat;

operatively connecting and configuring a processor and a memory to the plurality of sensors to receive data corresponding to amplitude waveforms created in each of the plurality of sensors by the magnetized object;

comparing, by the processor, the amplitude of a signal recorded by each sensor with the amplitude recorded by each of the other sensors to determine a magnetic moment and a physical size of a magnetized region of the object, and comparing a waveform signature from each sensor with a signature of an ideal magnetic dipole to determine characteristics of the object including a size of the magnetic moment, a location of the object with respect to the sensor, and a speed with which the object passed by the sensing structure; and based on characteristic waveforms created by the magnetized object passing by the plurality of sensors, detecting and discriminating the magnetized object; and utilizing an artificial intelligence or machine learning module to improve identification of the magnetized object based on the characteristic waveforms created by the magnetized object.

8. The method of claim 7, further comprising positioning and orienting the plurality of sensors on the rigid framework to discriminate between different types of magnetized objects.

9. The method of claim 7, wherein the rigid framework is at least partially non-metallic.

10. The method of claim 7, further comprising hiding the number, location, and orientation of the magnetic sensors in the rigid framework of the sensing structure, such that the screening area for detection of subjects with magnetized objects passing by is covert.

11. The method of claim 7, further comprising correlating the image or video of the subject with 3D locational data of the magnetized object calculated from data corresponding to amplitude waveforms created by the sensors to flag a location of the magnetized object in the image or video.

12. The method of claim 7, further comprising providing a captured image or video of a subject as an additional input to an artificial intelligence or machine learning module to improve system identification and discrimination of a magnetized object.

* * * * *